(12) United States Patent
Lee et al.

(10) Patent No.: US 10,705,117 B2
(45) Date of Patent: Jul. 7, 2020

(54) PROBE ASSEMBLY AND PROBE STRUCTURE THEREOF

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Yuan-Chiang Teng, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 85 days.

(21) Appl. No.: 16/154,846

(22) Filed: Oct. 9, 2018

(65) Prior Publication Data

US 2019/0265274 A1  Aug. 29, 2019

(30) Foreign Application Priority Data

Feb. 26, 2018  (TW) .............................. 107106386 A

(51) Int. Cl.
*G01R 1/067* (2006.01)
*G01R 1/073* (2006.01)
*H01L 21/00* (2006.01)

(52) U.S. Cl.
CPC ..... *G01R 1/06727* (2013.01); *G01R 1/07342* (2013.01)

(58) Field of Classification Search
CPC ........ H01L 21/00; H01L 2221/00; G01R 1/00
See application file for complete search history.

(56) References Cited

U.S. PATENT DOCUMENTS

| 8,451,015 | B2* | 5/2013 | Nielsen | G01R 31/64 324/754.1 |
| 2007/0126442 | A1* | 6/2007 | Watanabe | G01R 1/06727 324/755.07 |
| 2013/0082729 | A1* | 4/2013 | Fan | G01R 1/06727 324/755.07 |
| 2013/0321016 | A1* | 12/2013 | Hirakawa | G01R 1/06794 324/755.01 |
| 2014/0015561 | A1* | 1/2014 | Chang | G01R 1/07342 324/756.03 |
| 2017/0315149 | A1* | 11/2017 | Chen | G01R 1/0408 |

* cited by examiner

*Primary Examiner* — Jermele M Hollington
*Assistant Examiner* — Temilade S Rhodes-Vivour
(74) *Attorney, Agent, or Firm* — Li & Cai Intellectual Property (USA) Office

(57) ABSTRACT

A probe component and a probe structure thereof are provided. The probe structure includes a first contacting segment, a first connecting segment, a second connecting segment and a second contacting segment. The first contacting segment has an abutting portion and a first end portion connected to the abutting portion. The first connecting segment is connected to the first contacting segment. The second connecting segment is connected to the first connecting segment. The second contacting segment is connected to the second connecting segment and has a second end portion.

9 Claims, 8 Drawing Sheets

PROBE ASSEMBLY AND PROBE STRUCTURE THEREOF

BACKGROUND

1. Technical Field

The instant disclosure relates to a probe component and a probe structure thereof, and in particular, to a probe component for chip probe card and a probe structure thereof.

2. Description of Related Art

The method of manufacturing cantilever-type chip probe cards mainly includes artificially soldering the probes on the printed circuit board and using an adhesive such as an epoxy resin to fix the probes. For example, TW I447397 patent entitled "probe card" includes fixing the probe on the circuit board by a fixing portion containing epoxy resins.

However, after the epoxy resin is cured, the cantilever-type chip probe cards become hard to maintain and repair. Specifically, when a probe is damaged, it cannot be replaced individually and the whole set of the cantilever-type chip probe must be replaced.

In addition, the soldering wires in the cantilever-type probe cards require dense wire material for performing a fan-out process, and since the artificially soldering process requires larger operation space, the transmission path in the product is larger and results poor transmission quality. Furthermore, since the line diameter of the probe in the cantilever-type probe card in the existing art is relatively large, the lines must be stacked in the vertical direction in addition to being arranged in the transverse direction, thus increasing the difficulty of the probe arrangement.

SUMMARY

The problem to be solved of the instant disclosure is to provide a probe component and a probe structure thereof in which the probe component can effectively solve the problem related to the maintenance and repair of the cantilever-type probe and can improve the transmission quality while reducing the maintenance cost.

In order to solve the problem above, an embodiment of the instant disclosure provides a probes structure including a first contacting segment, a first connecting segment, a second connecting segment and a second contacting segment. The first contacting segment has an abutting portion and a first end portion connected to the abutting portion. The first connecting segment is connected to the first contacting segment. The second connecting segment is connected to the first connecting segment. The second contacting segment is connected to the second connecting segment, and the second contacting segment has a second terminal end.

Another embodiment of the instant disclosure provides a probe component including a substrate, a first plate and a plurality of probe structures. The substrate has a plurality of conductive structures. The first plate has a plurality of first through holes and a plurality of abutting parts. Each of the abutting parts is adjacent to one of the first through holes corresponding thereto, and each of the first through holes has a first aperture. Each of the plurality of probe structures includes a first contacting segment, a first connecting segment, a second connecting segment and a second contacting segment. The first contacting segment has an abutting portion and a first end portion connected to the abutting portion. The first connecting segment is connected to the first contacting segment, the second connecting segment is connected to the first connecting segment, the second contacting segment is connected to the second connecting segment, and the second contacting segment has a second end portion. A maximum outer diameter of the first contacting segment is smaller than the first aperture of the first through hole for enabling the first contacting segment to pass through the first through hole. The first contacting segment of each of the probe structures is electrically connected to each of the conductive structures. The abutting portion of each of the probe structures abuts against the abutting part corresponding thereto.

One of the advantages of the instant disclosure resides in that the probe component and the probe structure thereof provided by the instant disclosure can enable the probe structure to be replaced individually based on the technical feature of "The first contacting segment has an abutting portion", thereby forming a replaceable probes structure and reducing the manufacturing cost. In addition, compared to the cantilever-type probe structures in the existing art, the transmission path with non-continuously resistance can be reduced, thereby improving the signal integrity (SI) of the transmission quality.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
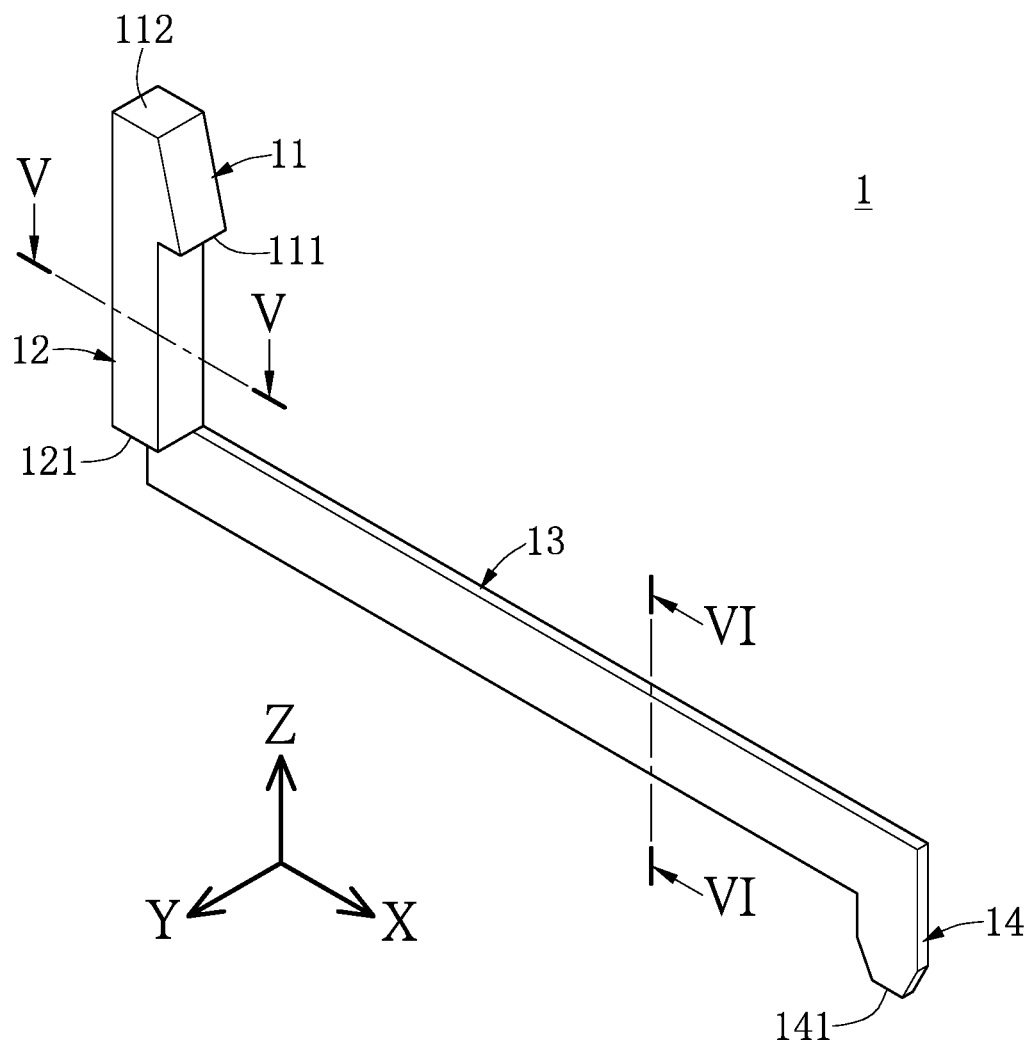
FIG. 1 is a three-dimensional schematic view of the probe structure of a first embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

It is noted that the term "first" and "second" for describing different elements or signals are only used to distinguish these elements/signals from one another rather than limiting the nature thereof. In addition, the term "or" used in the specification may include one or more of the listed items.

First Embodiment

Figure 2:
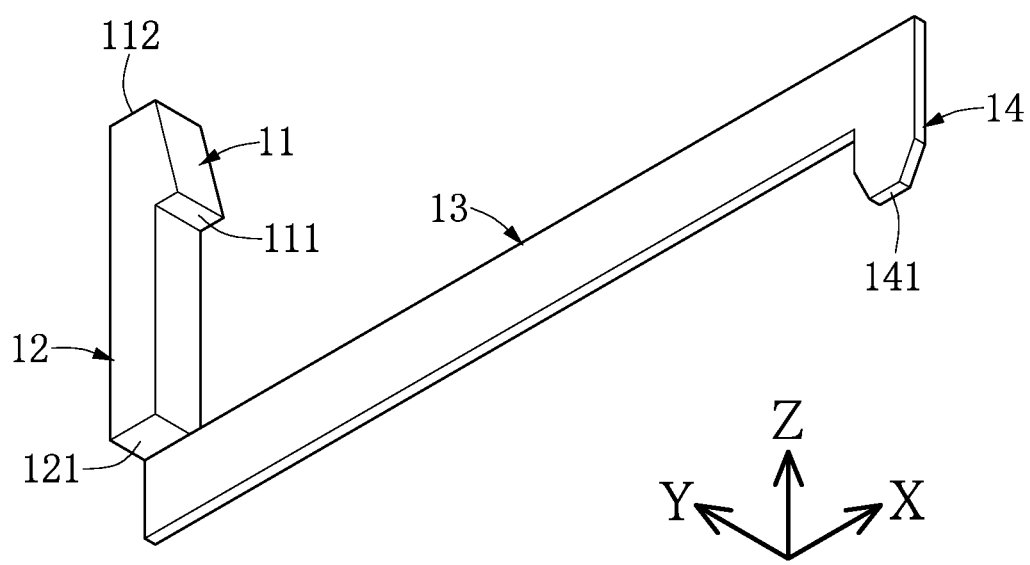
FIG. 2 is another three-dimensional schematic view of the probe structure of the first embodiment of the instant disclosure.
Figure 3:
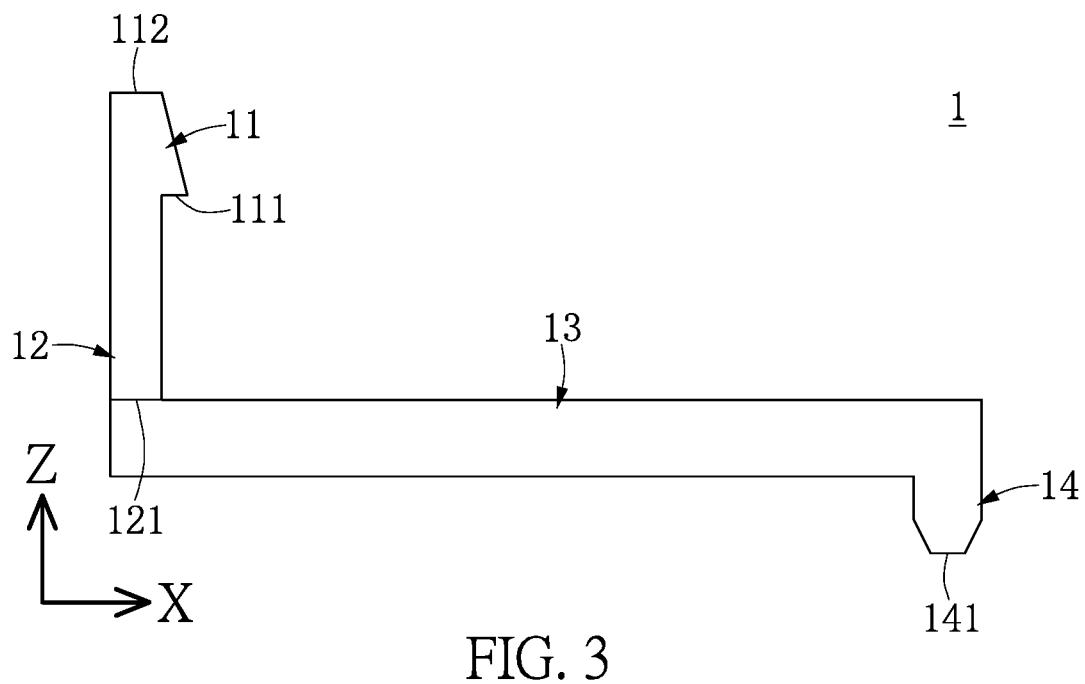
FIG. 3 is a side schematic view of the probe structure of the first embodiment of the instant disclosure.
Figure 4:
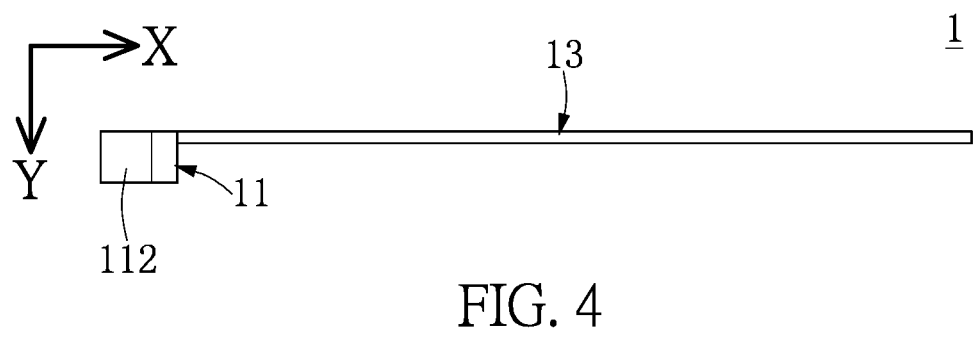
FIG. 4 is a top schematic view of the probe structure of the first embodiment of the instant disclosure.
Figure 11:
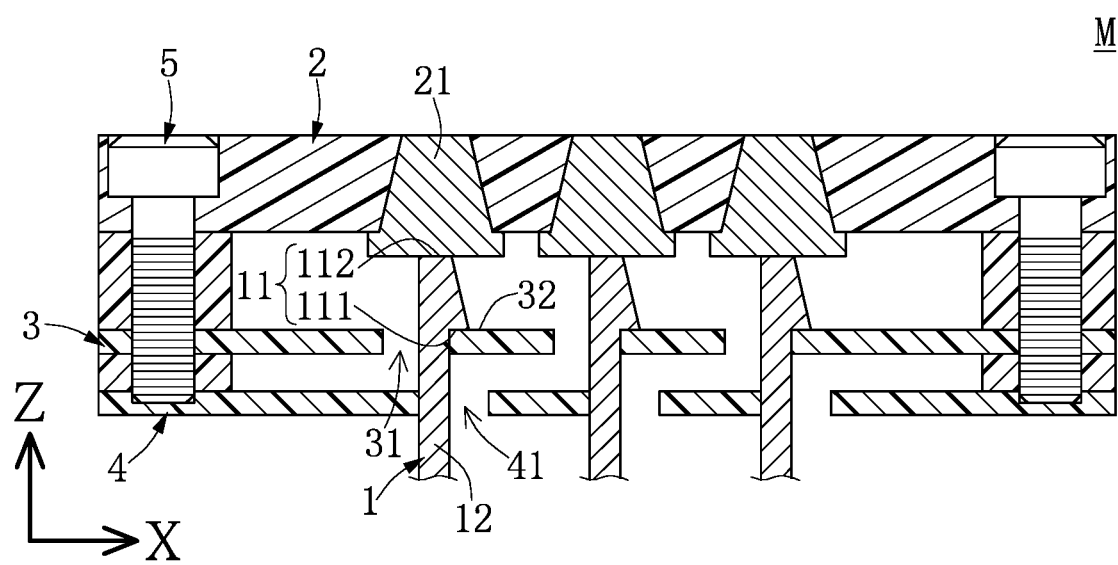
FIG. 11 is yet another side schematic view of the probe structure of the second embodiment of the instant disclosure.

Reference is made to FIG. 1 to FIG. 4 and FIG. 11. FIG. 1 and FIG. 2 are three-dimensional schematic views of the probe structure of a first embodiment of the instant disclosure. FIG. 3 is a side schematic view of the probe structure of the first embodiment of the instant disclosure. FIG. 4 is a top schematic view of the probe structure of the first embodiment of the instant disclosure. FIG. 11 is a side schematic view of the probe structure of the second embodiment of the instant disclosure. The instant disclosure provides a probe component M and a probe structure 1 thereof. The main technical features of the probe structure 1 are described in the first embodiment, and the details of the probe component M are described in the second embodiment.

As shown in FIG. 1 to FIG. 4, the probe structure 1 includes a first contacting segment 11, a first connecting segment 12, a second connecting segment 13 and a second contacting segment 14. The first contacting segment 11 can have an abutting portion 111 and a first end portion 112 connected to the abutting portion 111. The first connecting segment 12 can be connected to the first contacting segment 11, the second connecting segment 13 can be connected to the first connecting segment 12, the second contacting segment 14 can be connected to the second connecting segment 13, and the second contacting segment 14 can have a second end portion 141. In addition, in the embodiments of the instant disclosure, the probe structure 1 is a cantilever-type probe structure 1.

As shown in FIG. 1 and FIG. 2, in the embodiments of the instant disclosure, the first contacting segment 11 can be the needle tail of the probe structure 1 for being connected to the contacting end (such as the conductive structure 21 shown in FIG. 11) of a transfer board (such as the substrate 2 shown in FIG. 11). In addition, the second end portion 141 of the probe structure 1 can be needle-like for breaking the oxidation layer on the surface of a tin ball of the object to be measured. However, in other implementations, the contacting tip end 141 of the probe structure 1 can be a flat surface. The instant disclosure is not limited thereto. As shown in FIG. 1 to FIG. 3, the extension direction of the first contacting segment 11 (Z direction) and the extension direction of the contacting part 14 (negative Z direction) are different. For example, as shown in FIG. 3, the extension direction of the first contacting segment 11 and the extension direction of the second contacting segment 14 are substantially opposite to each other and parallel to each other. Furthermore, the first contacting segment 11 and the first connecting segment 12 can extend towards a first direction (Z direction), the second connecting segment 13 can extend towards a second direction (X direction), and the first and second directions are different. In the embodiments of the instant disclosure, the first direction can be substantially perpendicular to the second direction. In addition, the second contacting segment 14 can extend towards a third direction (negative Z direction), and the third direction is different from the second direction. The third direction can be substantially perpendicular to the second direction.

Figure 5:
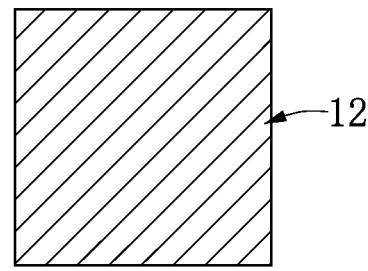
FIG. 5 is a side perspective schematic view taken along line V-V in FIG. 1.
Figure 6:
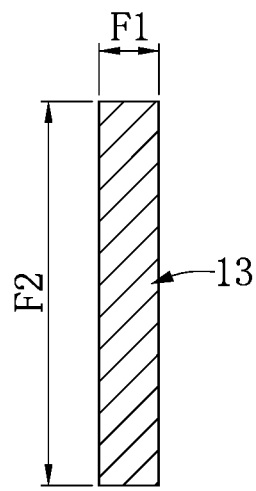
FIG. 6 is a side perspective schematic view taken along line VI-VI in FIG. 1.

Reference is made to FIG. 5 and FIG. 6. FIG. 5 is a side perspective schematic view taken along line V-V in FIG. 1, and FIG. 6 is a side perspective schematic view taken along line VI-VI in FIG. 1. In the embodiments of the instant disclosure, the shape of the cross section of the first connecting segment 12 perpendicular to the extension direction of the first connecting segment 12 and the shape of the cross section of the second connecting segment 13 perpendicular to the extension direction of the second connecting segment 13 are different. In other words, the cross section of the first connecting segment 12 is perpendicular to the extension direction of the first connecting segment 12, the cross section of the second connecting segment 13 is perpendicular to the extension direction of the second connecting segment 13, and the shape of the cross section of the first connecting segment 12 is different from that of the cross section of the second connecting segment 13. Preferably, in the embodiments of the instant disclosure, the area of the cross section of the first connecting segment 12 can be larger than the area of the cross section of the second connecting segment 13. Furthermore, preferably, the shape of the cross section of the first connecting segment 12 can be a rectangular shape (for example, the first connecting segment 12 is a column structure). In addition, the shape of the cross section of the second connecting segment 13 and/or the second contacting segment 14 can be in a sheet-shape (rectangular shape in the form of a thin sheet, for example, the second connecting segment 13 and/or the second contacting segment 14 is a sheet structure). Besides, the column structure and the sheet structure have different shapes. In addition, in the embodiments of the instant disclosure, the probe structure 1 is preferably manufactured by microeletromechanical systems (MEMS). In other words, the rectangular probe structure 1 in the present embodiment employs a different manufacturing process compared to a round probe.

Specifically, as shown in FIG. 1, FIG. 2 and FIG. 4, the first connecting segment 12 is connected to the second connecting segment 13, and the first connecting segment 12 can form an exposed surface 121 relative to the second connecting segment 13. In other words, since the shape of the cross section of the first connecting segment 12 and the shape of the cross section of the second connecting segment 13 are totally different, the first connecting segment 12 can form an exposed surface 121 relative to the second connecting segment 13. Therefore, the first connecting segment 12 and the second connecting segment 13 can have a step therebetween and are arranged discontinuously in the overall structure. Specifically, the connection between the first connecting segment 12 and the second connecting segment 13 is a turning segment and the turning segment can have an exposed surface 121.

As shown in FIG. 6, on any cross section of the second connecting segment 13, a first side edge (not numbered) and a second side edge (not numbered) can be located on the second connecting segment 13, and the first side edge can have a first width F1 and the second side edge can have a second width F2. The first width F1 can be smaller than the second width F2. The sheet structure can have a first width F1 and a second width F2, and the first width F1 is smaller than the second width F2. Preferably, the ratio between the first width F1 and the second width F2 can be from 0.2 to 0.5. For example, the first width F1 can be 0.1 millimeters (mm), and the second width F2 can be in the range of 2 to 5 mm. However, the instant disclosure is not limited thereto. Furthermore, since the direction of the force applied on the second connecting segment 13 is the Z direction, the length direction (extension direction) of the second side edge is towards the third direction (negative Z direction) and the second connecting segment 13 contacts the first connecting segment 12 through the first side edge having smaller size, even if the first width F1 is smaller than the second width F2, the force for abutting the object to be measured can be maintained.

As shown in FIG. 1 and FIG. 2, although the first abutting portion 111 of the first contacting segment 111 has a reverse-hook shape, in other embodiments, the shapes of the first abutting portion 111 can be in a concave shape. The instant disclosure is not limited thereto. Moreover, in other embodiments, the probe structure 1 can have a plurality of first abutting portions 111. The instant disclosure is not limited thereto.

Figure 7:
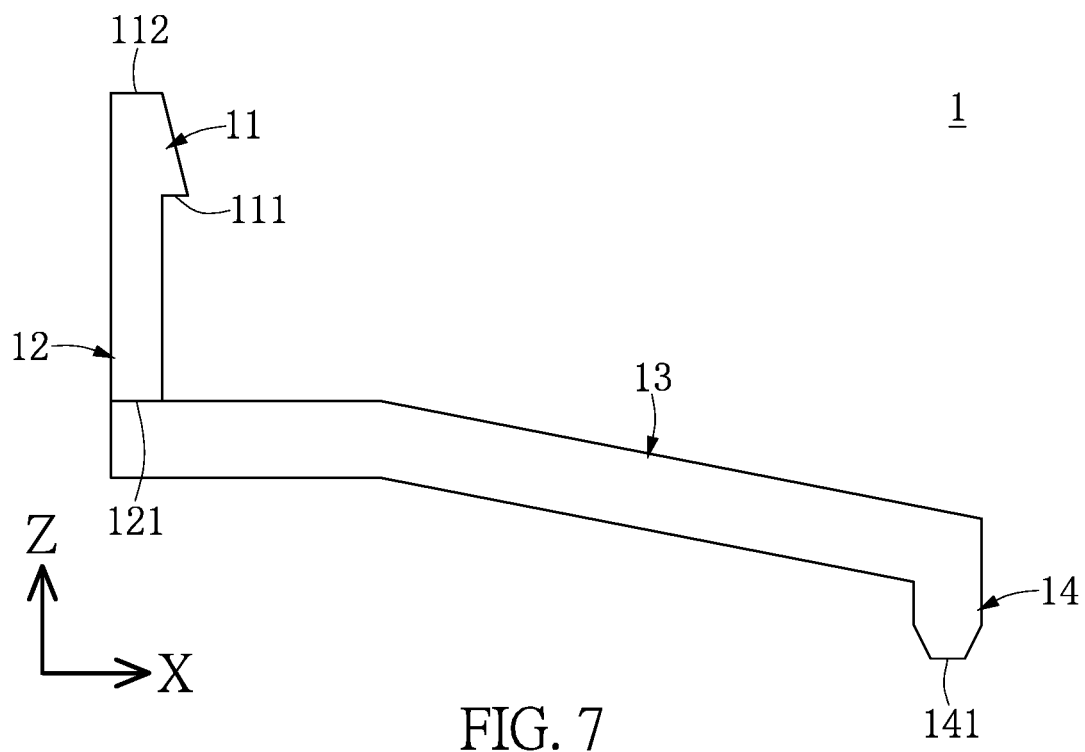
FIG. 7 is a side schematic view of another implementation of the probe structure of the first embodiment of the instant disclosure.
Figure 8:
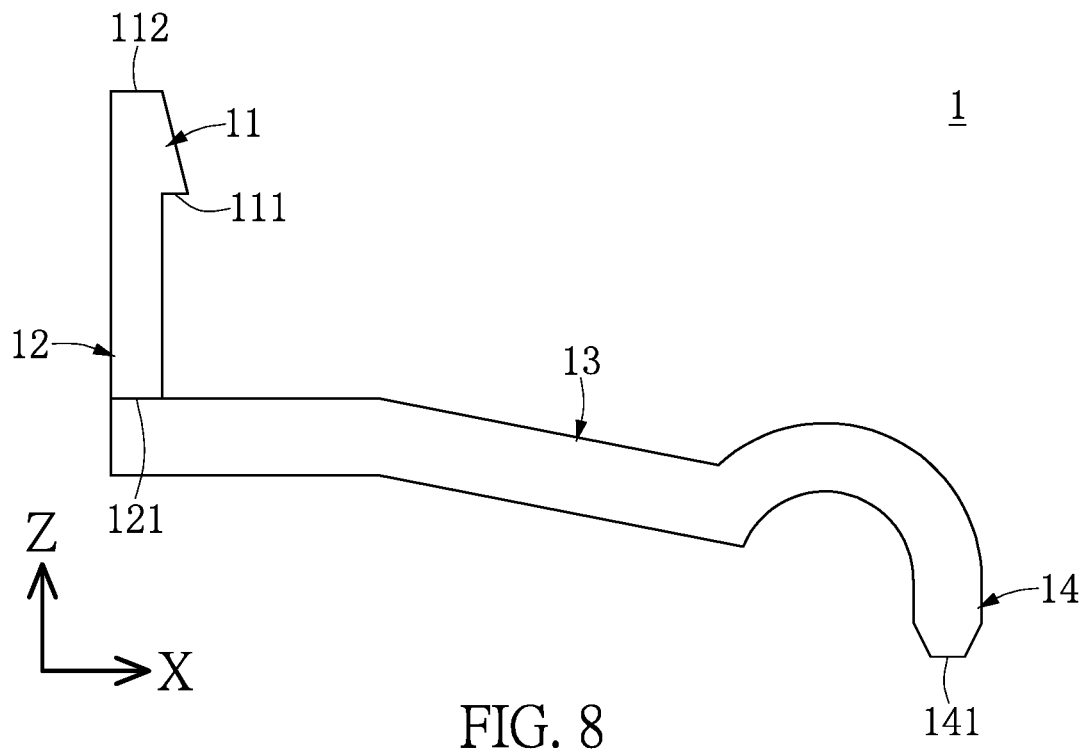
FIG. 8 is a side schematic view of yet another implementation of the probe structure of the first embodiment of the instant disclosure.

Next, reference is made to FIG. 7 and FIG. 8. FIG. 7 and FIG. 8 are side schematic views of other implementations of the probe structure of the first embodiment of the instant disclosure. Specifically, in other embodiments, the shape of the probe structure 1 can be adjusted. For example, in the implementations shown in FIG. 7 and FIG. 8, the shapes of the second connecting segment 13 and the second contacting segment 14 of the probe structure 1 can be adjusted for applying to different objects to be measured. It should be noted that the shapes of the second connecting segment 13 and the second contacting segment 14 are not limited in the instant disclosure.

Second Embodiment

Figure 9:
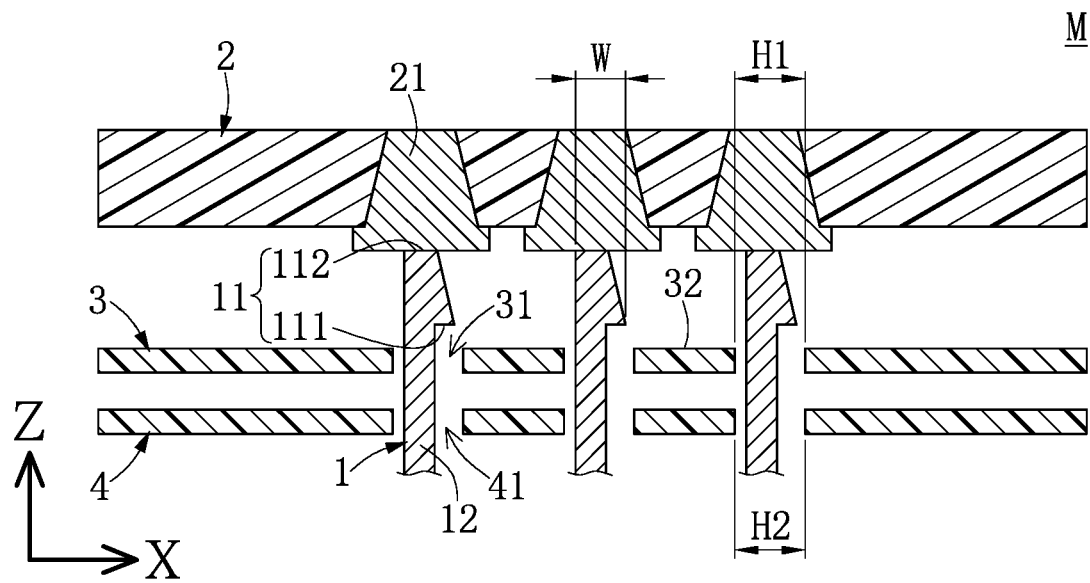
FIG. 9 is a side schematic view of a probe structure of a second embodiment of the instant disclosure.
Figure 10:
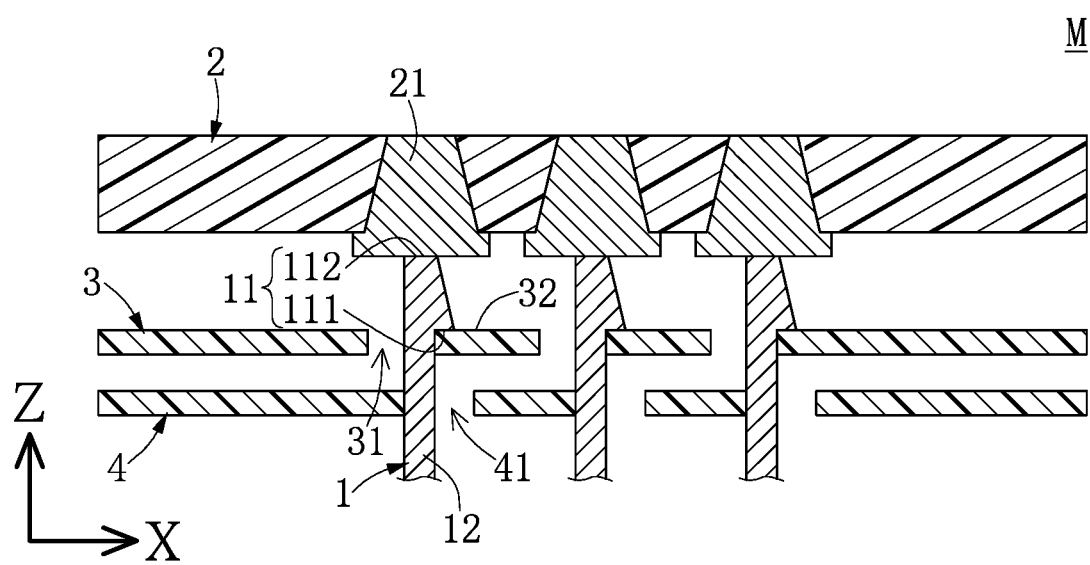
FIG. 10 is another side schematic view of the probe structure of the second embodiment of the instant disclosure.

Reference is made to FIG. 9 to FIG. 11. FIG. 9 to FIG. 11 are side schematic views of a probe structure M of a second embodiment of the instant disclosure during the assembly process. It should be noted that only a part of the probe component M is shown in the figures for illustrating the details of the embodiment. The structures of each component in the probe component M and the connections therebetween are described. The structure of the probe structure 1 provided in the second embodiment is similar to that of the previous embodiment and is not reiterated herein. Therefore, FIG. 1 and FIG. 2 are referred to as needed.

As shown in FIG. 9, the second embodiment of the instant disclosure provides a probe component M including a substrate 2, a first plate 3 and a plurality of probe structures 1. The substrate 2 can have a plurality of conductive structures 21. For example, the substrate 2 can be a transfer board or a space transformer (ST) for chip testing. In addition, in other embodiments, the substrate 2 can be a printed circuit board. In other words, since the probe structure 1 can be manufactured by microelectromechanical systems, it has smaller size and a space transformer may not be used. The probe structure 1 can be directly disposed on the printed circuit board for enabling the probe structure 1 to be electrically connected to the conductive structure 21 of the printed circuit board.

Referring to FIG. 9, the first plate 3 can have a plurality of first through holes 31 and a plurality of abutting portions 32. Each of the abutting portions 32 is adjacent to a first through hole 31 corresponding thereto, and each of the first through holes 31 has a first aperture H1. In addition, preferably, in the embodiments of the instant disclosure, the probe component M can further include a second plate 4. The second plate 4 can have a plurality of second through holes 41. For example, the second plate 4 can be substantially parallel to the first plate 3, and the locations of the second through holes 41 can correspond to the locations of the first through holes 31. Each of the second through holes 41 has a second aperture H2.

As shown in FIG. 9, FIG. 1 and FIG. 2, each of the probe structures 1 can include a first contacting segment 11, a first connecting segment 12, a second connecting segment 13 and a second contacting segment 14. The first contacting segment 11 can have an abutting portion 111 and a first end portion 112 connected to the abutting portion 111. In addition, the first connecting segment 12 can be connected to the first contacting segment 11, the second connecting segment 13 can be connected to the first connecting segment 12, the second contacting segment 14 can be connected to the second connecting segment 13, and the second contacting segment 14 can have a second end portion. It should be noted that the other structures of the probe structure 1 provided in the second embodiment are similar to that of the probe structure 1 provided in the previous embodiment, and hence, are not reiterated herein.

As shown in FIG. 9, a maximum outer diameter W of the first contacting segment 11 is smaller than the first aperture H1 of the first through hole 31 for enabling the first contacting segment 11 to pass through the first through hole 31. In addition, the maximum outer diameter W of the first contacting segment 11 is smaller than the second aperture H2 of the second through hole 41 for enabling the first contacting segment 11 to pass through the second through hole 41. Furthermore, the first contacting segment 11 of each of the probe structures 1 can be electrically connected to each of the conductive structures 21.

As shown in FIG. 10, the first plate 3 and the second plate 4 can be dislocated from each other by changing the relative position between the first plate 3 and the second plate 4 by a user. Specifically, the first plate 3 can be moved towards the X direction, and the second plate 4 can be moved towards the negative X direction. Therefore, the abutting portion 111 of each of the probe structures 1 can respectively abut against the corresponding abutting portion 32 for locating the probe structure 1.

As shown in FIG. 11, the probe component M can preferably further include a fixing member 5. For example, the fixing member 5 can be a screw, but the instant disclosure is not limited thereto. The fixing member 5 can be disposed on the substrate 2, the first plate 3 and the second plate 4 for enabling the abutting portion 111 of each of the probe structures 1 to respectively abut against the corresponding abutting portion 32 for locating the probe structure 1. In other words, the fixing member 5 can be used to determine the relative position between the probe structure 1 and the substrate 2, the first plate 3 and the second plate 4. In addition, it should be noted that since each of the probe structures 1 abuts against the corresponding abutting parts 32 through the first abutting portion 111, the fixing member 5 is used to locate the probe structure 1. Therefore, when one of the probe structures 1 is damaged, the damaged probe structure 1 can be replaced by moving the first plate 3 and the second plate 4.

It should be noted that since the cross sections of the first connecting segment 112 and the second connecting segment 122 can be rectangular, the cross section of the connecting segment 13 can be in a sheet-shape (rectangular shape as a thin film). Therefore, after disposing the second plate 4 and after embedding the first contacting segment 11 and the first connecting segment 12 (a part of the first connecting segment 12 or the entire first connecting segment 12) in a location between the second plate 4 and the substrate 2, two probe structures 1 can be prevented from being affected by the interference between the second connecting segments 13.

Figure 12:
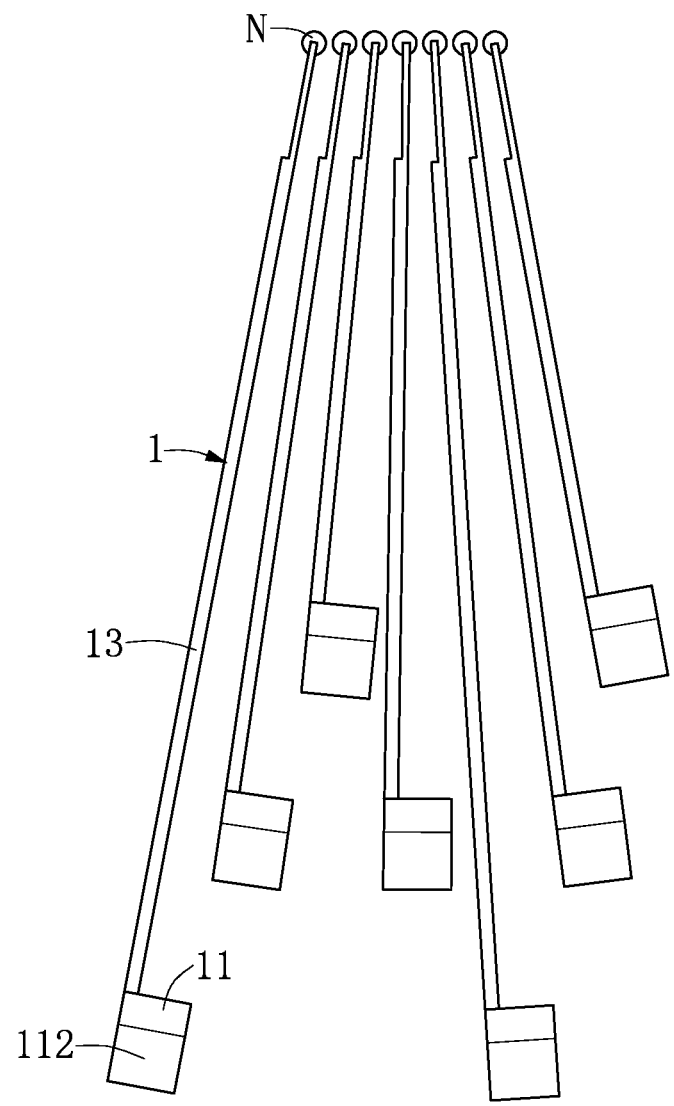
FIG. 12 is a use state of the probe structure of the second embodiment of the instant disclosure.

Reference is made to FIG. 12. FIG. 12 is a schematic view showing the use state of the probe structure of the second embodiment of the instant disclosure. In other words, FIG. 12 is a top schematic view of a plurality of probe structures 1. As shown in FIG. 12, the probe structures 1 can be arranged based on the testing array of the probe card. In addition, the plurality of probe structures 1 can have different structures. For example, at least two of the plurality of probe structures 1 can have different lengths. In other words, the arranging angle of each of the probe structures 1 can be adjusted based on actual needs. In addition, the second contacting segment 14 of the probe structure 1 can be electrically connected to the contacting point of object to be measured N.

Effect of the Embodiments

One of the advantages of the instant disclosure resides in that the probe component M and the probe structure 1 thereof provided by the instant disclosure can enable the probe structure 1 to be replaced individually based on the technical feature of "The first contacting segment 11 has an abutting portion 111", thereby forming a replaceable probes structure 1 and reducing the manufacturing cost. In addition, compared to the cantilever-type probe structures in the existing art, the transmission path with non-continuously resistance can be reduced, thereby improving the signal integrity (SI) of the transmission quality.

In addition, since the probe structure 1 provided by the embodiments of the instant disclosure is a cantilever-type probe structure, it has needle points that point outwardly. The probe structure 1 can be fixed on the substrate 2 by multiple sets of different first plate 3, second plate 4 and fixing member 5. Specifically, probe structures 1 having different lengths can be used for reducing the difficulty of the manufacture of the fine pitch. In addition, since the cross sections of the connecting segment 13 can be sheet-like (thin film)-the first connecting segment 12 is a column structure and the connecting segment 13 is a sheet structure, and the column structure is different from the sheet structure-the requirement of the fine pitch can be met, and the structure can provide required supporting force.

Specifically, the first abutting portion 111 of the probe structure 1 can respectively abut against the corresponding abutting portions 32 of the first plate 3, and the probe structure 1 can be located on the substrate 2 for enabling the first contacting segment 11 the probe structure 1 to be electrically connected to the conductive structure 21 on the substrate 2.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A probe structure, comprising:
   a first contacting segment having an abutting portion and a first end portion connected to the abutting portion;
   a first connecting segment connected to the first contacting segment, wherein the first connecting segment forms an exposed surface relative to the second connecting segment;
   a second connecting segment connected to the first connecting segment; and
   a second contacting segment connected to the second connecting segment, the second contacting segment having a second terminal end;
   wherein a cross section of the first connecting segment is perpendicular to an extension direction of the first connecting segment, a cross section of the second connecting segment is perpendicular to an extension direction of the second connecting segment, and a shape of the cross section of the first connecting segment and a shape of the cross section of the second connecting segment are different;
   wherein an area of the cross section of the first connecting segment is larger than an area of the cross section of the second connecting segment;
   wherein the first contacting segment and the first connecting segment extend towards a first direction, the second connecting segment extends towards a second direction, and the first direction and the second direction are different;
   wherein a connection between the first connecting segment and the second connecting segment is a turning segment, and the turning segment has the exposed surface.

2. The probe structure according to claim 1, wherein the probe structure is a cantilever-type probe structure.

3. The probe structure according to claim 1, wherein an extension direction of the first contacting segment and an extension direction of the second contacting segment are different.

4. The probe structure according to claim 1, wherein the abutting portion is configured to abut against an abutting art of a first plate.

5. The probe structure according to claim 1, wherein the first connecting segment is a column structure, the second connecting segment is a sheet structure, and the column structure and the sheet structure have different shapes.

6. A probe component, including:
   a substrate having a plurality of conductive structures;
   a first plate having a plurality of first through holes and a plurality of abutting parts, each of the abutting parts being adjacent to one of the first through holes corresponding thereto, each of the first through holes having a first aperture; and
   a plurality of probe structures, each of the plurality of probe structures including a first contacting segment, a first connecting segment, a second connecting segment and a second contacting segment, wherein the first contacting segment has an abutting portion and a first end portion connected to the abutting portion, the first connecting segment being connected to the first contacting segment, the second connecting segment being connected to the first connecting segment, the second contacting segment being connected to the second connecting segment, the second contacting segment having a second end portion;
   wherein a maximum outer diameter of the first contacting segment is smaller than the first aperture of the first through hole for enabling the first contacting segment to pass through the first through hole;

wherein the first end portion of the first contacting segment of each of the probe structures abuts against the conductive structures corresponding thereto;

wherein the abutting portion of the first contacting segment of each of the probe structures abuts against the abutting part corresponding thereto;

wherein the first contacting segment of each of the probe structures abuts against between the corresponding conductive structures and the corresponding abutting part.

7. The probe component according to claim 6, further including: a second plate having a plurality of second through holes, the second plate being substantially parallel to the first plate, the plurality of the second through holes respectively corresponding to the plurality of the first through holes, and each of the second through hole has a second aperture.

8. The probe component according to claim 6, further including: a fixing member disposed on the substrate, the first plate and the second plate for abutting the abutting portions of each of the probe structures against the abutting part corresponding thereto.

9. The probe component according to claim 6, wherein the probe structure is a cantilever-type probe structure.

\* \* \* \* \*